United States Patent [19]

Etoh

[11] Patent Number: 5,448,190
[45] Date of Patent: Sep. 5, 1995

[54] VOLTAGE-TO-CURRENT CONVERSION CIRCUIT UTILIZING MOS TRANSISTORS

[75] Inventor: Toshiyuki Etoh, Tokyo, Japan
[73] Assignee: NEC Corporation, Tokyo, Japan
[21] Appl. No.: 214,490
[22] Filed: Mar. 18, 1994
[30] Foreign Application Priority Data
  Mar. 30, 1993 [JP] Japan .................. 5-071387
[51] Int. Cl.⁶ .............. H03M 11/00; H03K 17/04; G05F 1/10
[52] U.S. Cl. ............... 327/103; 327/579; 327/543
[58] Field of Search ........... 327/103, 100, 80, 81, 327/375, 579, 538, 543, 540, 541, 545, 546; 323/312, 315

[56] References Cited

U.S. PATENT DOCUMENTS

| | | | |
|---|---|---|---|
| 4,338,527 | 7/1982 | Nagano | 327/103 |
| 4,450,366 | 5/1984 | Malhi et al. | 323/315 |
| 4,952,866 | 8/1990 | Van Tuijl | 323/312 |
| 4,961,046 | 10/1990 | De Jager | 327/103 |
| 5,391,979 | 2/1995 | Kajimoto et al. | 327/543 |

FOREIGN PATENT DOCUMENTS 59221014 12/1984 Japan .

*Primary Examiner*—Tinmothy P. Callahan
*Assistant Examiner*—Toan Tran
*Attorney, Agent, or Firm*—Whitham, Curtis, Whitham & McGinn

[57] ABSTRACT

A voltage-to-current conversion circuit is disclosed which includes a MOS transistor of a source-grounded type having a gate connected to an input terminal, an output circuit producing an output current at an output terminal in response to a drain current of the transistor, and a control circuit maintaining the drain voltage of the transistor to such a value that has the transistor operates in a non-saturation (triode) region.

10 Claims, 2 Drawing Sheets

5,448,190

VOLTAGE-TO-CURRENT CONVERSION CIRCUIT UTILIZING MOS TRANSISTORS

BACKGROUND OF THE INVENTION

The present invention relates to a voltage-to-current conversion circuit and, more particularly, to such a circuit as utilizing an insulated gate field effect (MOS) transistors.

A voltage-to-current conversion circuit is essential to a signal processing circuit handling an analog signal and thus widely employed therein. This circuit fundamentally uses a current mirror circuit composed of transistors there are two types in such a circuit, a bipolar type and a MOS type.

The voltage-to-current conversion circuit of the bipolar type is typically disclosed in Japanese. Laid-open patent No. Sho 59-221014. The basic circuit construction thereof is shown in FIG. 3 attached herewith (and corresponds to FIG. 5 of the above patent No.). Specifically, this circuit includes a current mirror circuit composed of PNP bipolar transistors 20 and 22, an input resistor 60, a constant current source composed of an NPN bipolar transistor 21, a resistor 61 and a constant voltage source 80, and an operational amplifier 40 which are connected as shown. The amplifier 40 cooperates with the transistor 20 to form a strong negative feedback loop. Accordingly, the current flowing through the resistor 60 in response to an input signal voltage supplied to an input terminal 90 is determined by the resistance value of the resistor 60 and the voltage amplitude of the input signal voltage. This current is supplied to the transistor 20 and thus derived from an output terminal 91 through the transistor 22 as the mirror current. The voltage-to-current conversion is thus attained. This circuit can handle a relatively large input voltage and further operate under a relatively low power voltage (1.8 V).

The conversion circuit of the MOS type shown in FIG. 4 is well in the art, on the other hand. This circuit also includes a current mirror circuit composed of P-channel MOS transistors 30 and 32 and an operational amplifier 41. However, this circuit converts the input signal voltage into the current by an N-channel MOS transistor 31, a resistor 62 and the amplifier 41 and then produces the converted current through the current mirror circuit. Specifically, the negative feedback loop composed of the transistor 31 and the amplifier 41 causes the input signal voltage to appear across the resistor 62. The current determined by the resistance value of the resistor 62 and the voltage amplitude is thereby derived from the output terminal 92 through the transistor 31 and the current mirror circuit. The present circuit is advantageous to have a high input impedance due to the operational amplifier 41 receiving the input voltage.

Referring again to FIG. 3, the bipolar transistors constituting this circuit can be replaced by MOS transistors. However, the circuit thus replaced requires a power supply voltage larger than that applied to the circuit of FIG. 3. This is because the threshold voltage and the saturated voltage of the MOS transistor are higher than those of the bipolar transistor. Therefore, the conversion circuit of FIG. 3 is preferable in use in a low power voltage system. However, the input impedance is determined by the resistor 60 and thus cannot be enhanced. A source follower circuit is, for example, required to enhance the input impedance, so that the amplitude of the input voltage is restricted.

On the other hand, the circuit shown in FIG. 4 has a high input impedance, as described hereinbefore. However, the source voltage of the transistor 31 is increased in accordance with increase in voltage of the input signal. For this reason, a relatively high drain voltage is needed. The power supply voltage is required to be high accordingly, or the input signal voltage is restricted.

SUMMARY OF THE INVENTION

It is therefore an object of the present invention to provide an improved voltage-to-current conversion circuit utilizing MOS transistors.

It is another object of the present invention to provide a voltage-to-current conversion circuit of a MOS type which can handle a relatively large input signal voltage with a low power supply voltage.

A conversion circuit according to the present invention comprises a MOS transistor of a source-grounded type having a gate connected to an input terminal, a current circuit leading a drain current of the transistor to an output terminal, and a control circuit for maintaining the drain voltage of the transistor to such a value that makes the transistor operate in a non-saturation region or a triode region.

Thus, the transistor operates in the source-grounded manner and in the non-saturation region. Accordingly, the transistor can handle large input voltage with a low power supply voltage.

BRIEF DESCRIPTION OF THE DRAWINGS

The above and other objects, features and advantages of the present invention will be more apparent from the following detailed description taken in conjunction with the accompanying drawings, wherein.

DETAILED DESCRIPTION OF THE PREFERRED EMBODIMENTS

Figure 1:
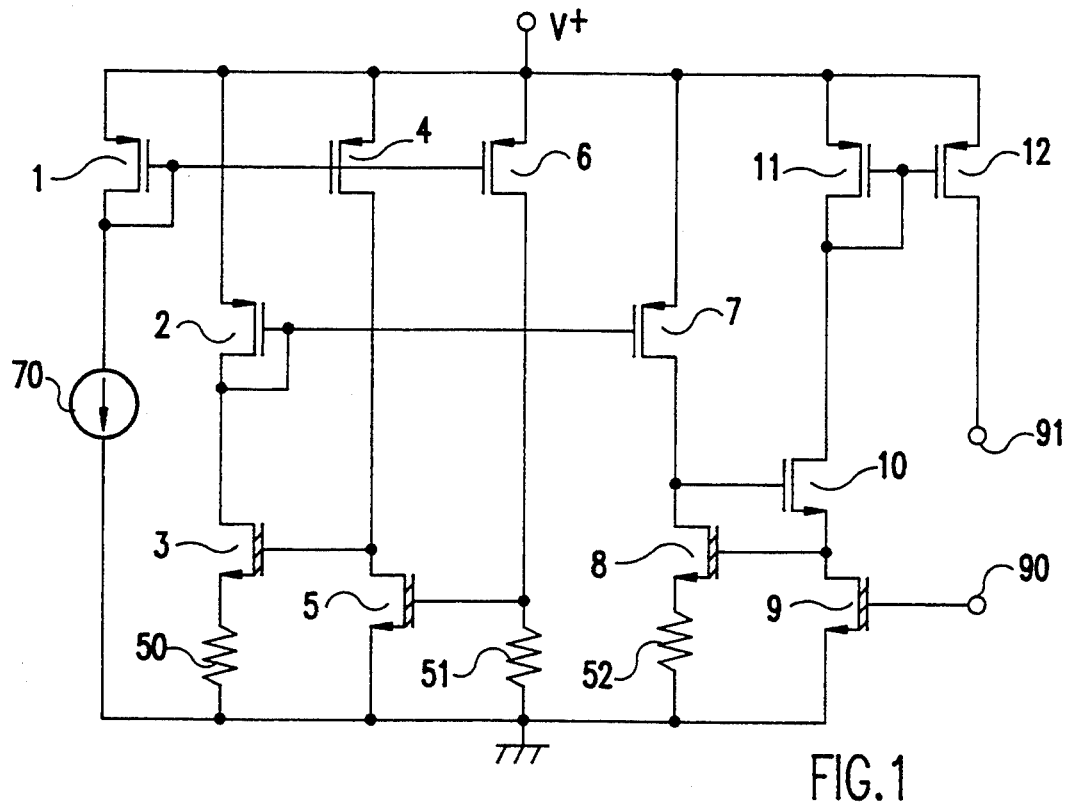
FIG. 1 is a circuit diagram illustrative of a first embodiment according to the present invention.

Referring to FIG. 1, a voltage-to-current conversion circuit according to the first embodiment of the present invention includes seven P-channel MOS transistors 1, 2, 4, 6, 7, 11 and 12, five N-channel MOS transistors 3, 5, 8, 9 and 10, three resistors 50, 51 and 52 and a current source 70 which are connected as shown. Each of the transistors 3, 5 and 8 has its threshold voltage of about 0 V, each of the remaining transistors has its threshold voltage of 0.6 to 0.8 V. The transistors 1, 4 and 6 cooperate with one another to constitute a current mirror circuit and hence the constant current form the current source 70 is derived from the transistors 4 and 6. The current from the transistor 6 produces a constant voltage drop across the resistor 51, which voltage drop biases the transistor 5. It should be noted that although the transistor 5 intends to flow the current corresponding to the biased voltage by the resistor 51, the current actually flowing through the transistor 5 is the same as the current from the transistor 4.

Representing the resistance value of the resistor 51, each of the drain current of the transistors 4 and 6, and the gatesource voltage of the transistor 5 as $R_0$, $R_O$, $I_B$, and $V_{GS5}$, respectively, the following equation (1) is obtained:

$$v_{GS5} = R_0 \times I_B \tag{1}$$

That is, the transistor 5 intends to flow the current corresponds to the bias voltage indicative of (1), but the current $I_B$ flows in fact therethrough. Therefore, it becomes possible to make the transistor 5 operate in the non-saturation or triode region by designing the current $I_B$ to a value as follows:

$$I_B << \frac{\mu_n C_{OX} W}{2L}(V_{GS5} - V_{TO})^2 \tag{2}$$

wherein W and L represents the gate width and length of the transistor 5, $V_{To}$ represents the threshold voltage thereof, $\mu n$ represents the surface mobility of electrons and $C_{ox}$ represents the gate capacitance per unit.

The drain voltage $V_x$ of the transistor 5 operating in the non-saturation region is represented as follows and takes a value of 0.1 to 0.2 V which is very close to zero:

$$I_B = \mu_n C_{OX}\left(\frac{W}{L}\right)(R_0 I_B - V_{TO})V_X - \frac{1}{2}\mu_n C_{OX}\left(\frac{W}{L}\right)V_X^2 \tag{3}$$

As described hereinbefore, the threshold voltage $V_{To}$ is about zero voltage and the drain voltage $V_x$ thereof is very close to zero, and therefore the equation (3) can be rewritten as follows:

$$I_B = \mu_n C_{OX}\left(\frac{W}{L}\right)R_0 I_B V_X \tag{4}$$

The drain voltage of the transistor 5 operating in the non-saturation (triode) region is converted into a current by the transistor 3 and the resistor 50, and the current thus converted is supplied to the transistor 2 and thus appears as a drain current of the transistor 7. This is because the transistors 2 and 7 form a current mirror circuit. The drain of the transistor 7 is connected to a circuit composed of the transistor 8 and the resistor 52. The transistor 10 is connected to the transistor 8 to form a negative feedback loop. Accordingly, the same current flows through the transistors 3 and 8 when the sizes of the transistors are identical with each other, the resistors 50 and 52 have the same values as each other and the current gain of the current mirror circuit composed of the transistors 2 and 7 is 1. In other words, the gate of the transistor 8 is applied with and fixed to such a voltage that makes the current flowing through the transistor 3 equal to the current flowing through the transistor 8. The gate voltage of the transistor 8 is equivalent to the drain voltage $V_X$ of the transistor 5. Since the drain of the transistor 9 is connected to the gate of the transistor 8, the drain voltage of the transistor 9 becomes to be equal to and maintained to the voltage $V_X$. That is, the transistors 8 and 10 and the resistor 52 converts the current, which is obtained by converting the drain voltage of the transistor 5 operating in the non-saturation region, again into the voltage corresponding thereto. Thus, the transistor 9 also operates in the nonsaturation (triode) region similarly to the transistor 5, and the drain current thereof is represented as follows:

$$I_{D9} = \mu_n C_{OX}\left(\frac{W}{L}\right)V_X V_{GS9} \tag{5}$$

From the equations (4) and (5), we obtain the following:

$$I_{D9} = (1/R_0) \times V_{GS9} \tag{6}$$

Since the current gain of the current mirror circuit composed of the transistors 11 and 12 is one, the output current $I_{out}$ derived from the input terminal 90 is equal to the current $I_{D9}$, and represented as follows:

$$I_{OUT} = (1/R_0) \times V_{in} \tag{7}$$

wherein the input signal voltage $V_{in}$ is equal to the gate-source voltage $V_{GS9}$ of the transistor 9.

Thus, the present circuit performs the voltage-to-current conversion operation on the input signal voltage. Moreover, the conversion operation is being performed so long as the transistor 9 operates in the non-saturation region, and therefore the amplitude of the input signal is not limited. On the other hand, the minimum power supply voltage allowing the present circuit to operate is determined by the gate-source voltage of the transistor 10 and the sum of the drain-source voltages of the transistor 7 and 9 and takes a value of about 2 V.

The resistors 50 and 52 are provided for the purpose of reducing the power consumption and therefore may be omitted.

Figure 2:
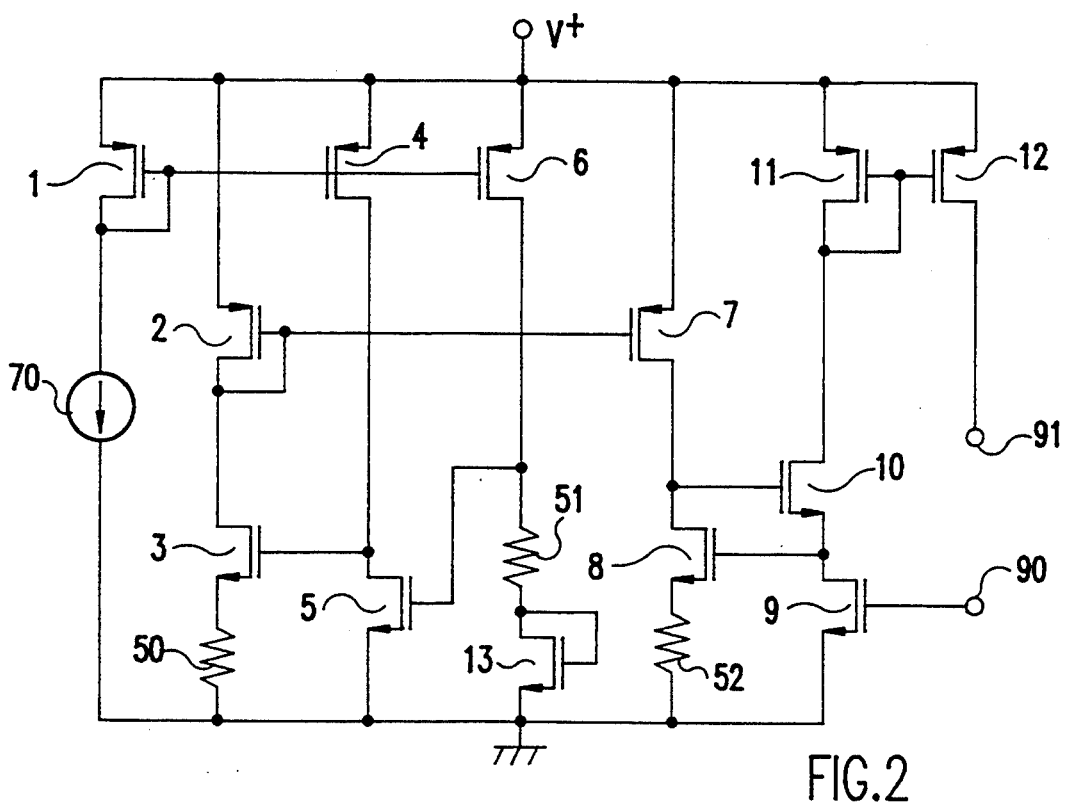
FIG. 2 is a circuit diagram illustrative of a second embodiment according to the present invention.
Figure 3:
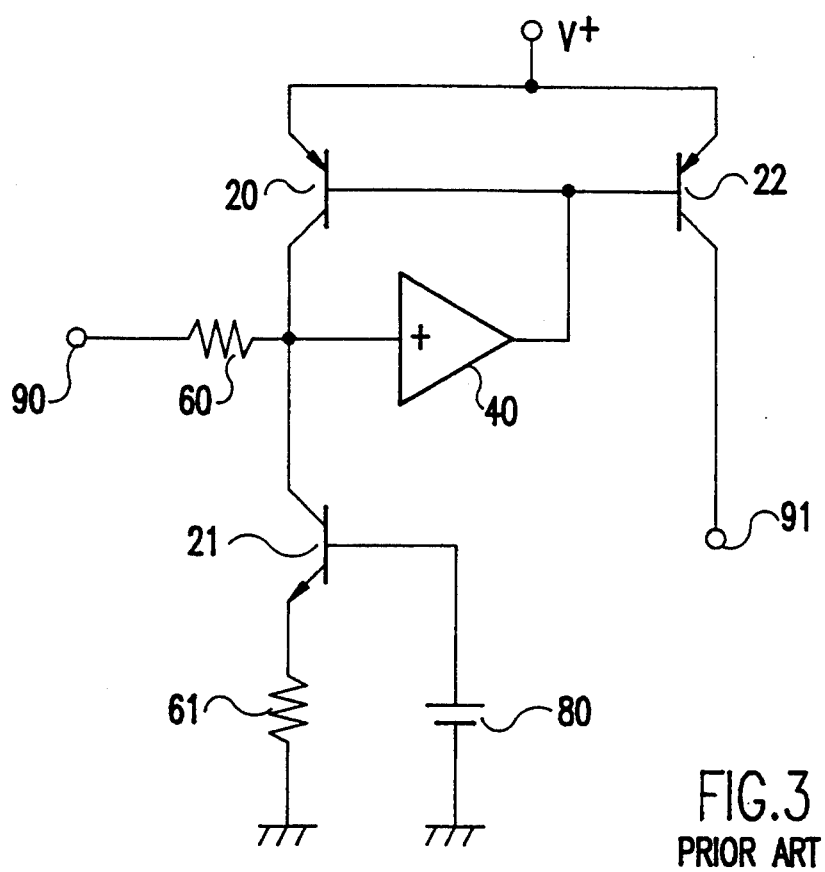
FIG. 3 is a circuit diagram illustrative of a prior art.
Figure 4:
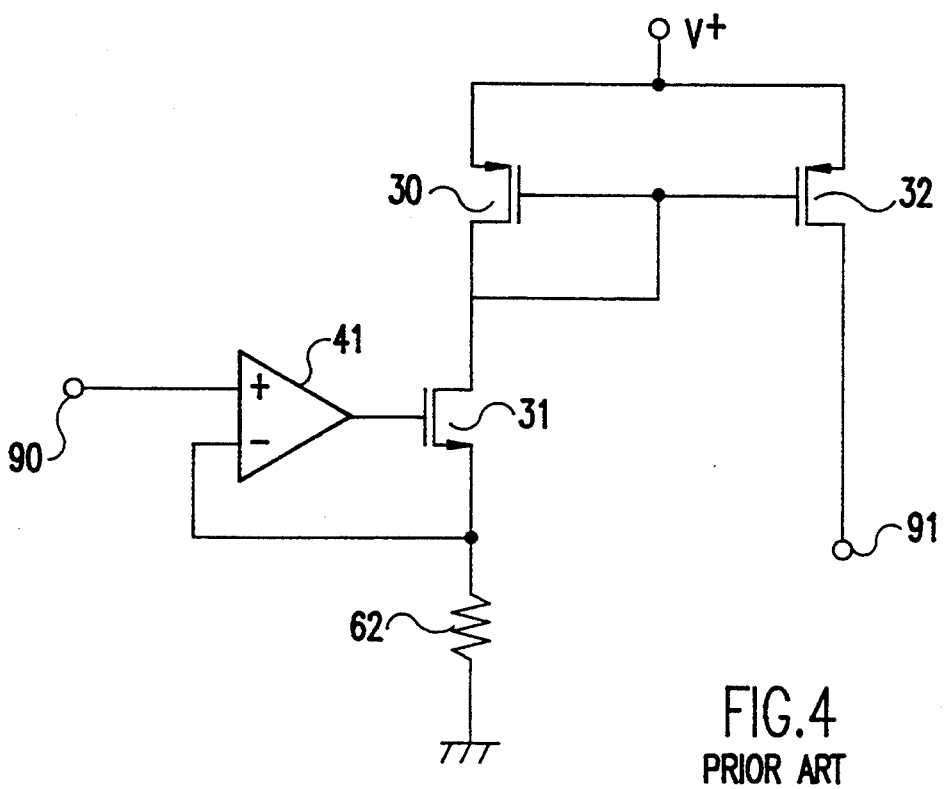
FIG. 4 is a circuit diagram illustrative of another prior art.

Turning to FIG. 2, there is shown a circuit according to a second embodiment of the present invention, wherein the same constituents as those shown in FIG. 1 are denoted by the same reference numerals to omit the further description thereof in this circuit, all the transistors are designed to have the conventional threshold voltage, 0.6 to 0.8 V. Therefore, a diode-connected N-channel MOS transistor 13 is added in series with the resistor 51 to bias the transistor 5.

Since the circuit operation of this circuit is identical with that of the circuit of FIG. 1 and thus will be omitted. Since the transistor 9 is designed to have the above threshold voltage, the present circuit converts the input signal having an amplitude from the threshold voltage to the power supply voltage, whereas the circuit of FIG. 1 handles the input signal having an amplitude from about zero to the power supply voltage. However the present circuit is derived at low cost than the circuit of FIG. 1 because of all the transistor having the same threshold voltage.

It is apparent that the present invention is not limited to the above embodiments but may be modified and changed without departing from the scope and spirit of the invention. For example, the current gain of each current mirror circuit can set to a desired value other one. The channel types of the respective transistors are changeable.

What is claimed is:

1. A voltage-to-current conversion circuit comprising a first transistor of a source-grounded type having a gate connected to an input terminal supplied with a signal voltage, an output terminal, an output circuit coupled to said first transistor and said output terminal and leading a drain current of said first transistor to said output terminal, and a control circuit coupled to said first transistor and maintaining a drain voltage of said first transistor to such a value that has said first transistor operate in a non-saturation region.

2. The circuit as claimed in claim 1, wherein said output circuit includes a second transistor having a source connected to the drain of said first transistor and said control circuit includes a third transistor of a source-grounded type having a drain and a gate connected respectively to a gate and the source of said second transistor, a fourth transistor operating in a non-saturation region, and means for supplying a drain of said third transistor with a current relative to a drain current of said fourth transistor.

3. The circuit as claimed in claim 2, wherein said output circuit further includes a current mirror circuit having an input node connected to a drain of said second transistor and an output node connected to said output terminal.

4. A voltage-to-current conversion circuit comprising a first transistor of a source-grounded type having a gate connected to a voltage input terminal a second transistor of a source-grounded type, control means for controlling said second transistor such that said second transistor operates in a nonsaturation region, bias means for biasing a drain of said first transistor by predetermined voltage relative to a drain voltage of said second transistor to cause said first transistor to operate in a non-saturation region, and output means coupled to said first transistor for deriving an output current in response to a drain current of said first transistor.

5. The circuit as claimed in claim 4, wherein said control means includes means for supplying a bias voltage between a gate and a source of said second transistor and means for supplying said second transistor with a current that is smaller than a current which said second transistor has an ability to produce in response to said bias voltage, and said bias means includes first converting means for converting the drain voltage of said second transistor into a first current, second converting means for converting said first current into a first voltage and means for supplying said first voltage to the drain of said first transistor as said predetermined voltage.

6. The circuit as claimed in claim 5, wherein first converting means includes a third transistor of a source-grounded type having a gate connected to the drain of said second transistor and said second converting means includes a fourth transistor of a source-grounded type having a gate connected to the drain of said first transistor, said third transistor producing a drain current which is supplied to said fourth transistor as a drain current thereof.

7. The circuit as claimed in claim 6, wherein said output means includes a fifth transistor having a gate and a source connected respectively to the drain and the gate of said fourth transistor, said output current being derived through said fifth transistor.

8. A voltage-to-current conversion circuit comprising a first transistor of a source grounded type having a gate connected to an input terminal, a second transistor of a source-grounded type having a gate connected to a drain of said first transistor, a third transistor having a gate connected to the drain of said second transistor, a source connected to the drain of said first transistor and a drain connected to an output terminal, a fourth transistor of a source-grounded type having a gate supplied with a constant voltage, a fifth transistor of a source-grounded type having a gate connected to a drain of said fourth transistor, and a current mirror circuit having a input node connected to a drain of said fifth transistor and an output node connected to the drain of said second transistor, said first and fourth transistors operating a non-saturation region.

9. The circuit as claimed in claim 8, wherein each of said first, second, fourth and fifth transistor has a threshold voltage smaller than a threshold voltage of said third transistor.

10. The circuit as claimed in claim 8, wherein said first to fifth transistors have threshold voltages equal to one another.

* * * * *